(12) United States Patent
Tanaka et al.

(10) Patent No.: US 6,590,186 B2
(45) Date of Patent: Jul. 8, 2003

(54) HEAT TREATMENT APPARATUS AND METHOD

(75) Inventors: Takashi Tanaka, Kikuchi-gun (JP); Shinji Nagashima, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/055,956

(22) Filed: Jan. 28, 2002

(65) Prior Publication Data

US 2002/0123236 A1 Sep. 5, 2002

(30) Foreign Application Priority Data

Jan. 30, 2001 (JP) ........................................ 2001-022260

(51) Int. Cl.[7] ................................................ F27B 5/14
(52) U.S. Cl. .................... 219/390; 219/405; 219/411; 118/724; 118/725; 118/50.1; 118/728; 118/729; 392/416
(58) Field of Search ................................. 219/390, 405, 219/411; 392/416, 418; 118/724, 725, 50.1, 728, 729, 730

(56) References Cited

U.S. PATENT DOCUMENTS

| | | | | |
|---|---|---|---|---|
| 4,798,165 A | * | 1/1989 | deBoer et al. | 118/715 |
| 4,976,996 A | * | 12/1990 | Monkowski et al. | 27/255.5 |
| 5,261,960 A | * | 11/1993 | Ozias | 118/719 |
| 6,190,459 B1 | | 2/2001 | Takeshita et al. | |
| 6,246,030 B1 | | 6/2001 | Matsuyama | |
| 6,403,924 B1 | * | 6/2002 | Hayashi | 219/390 |

* cited by examiner

*Primary Examiner*—Teresa Walberg
*Assistant Examiner*—Shawntina Fuqua
(74) *Attorney, Agent, or Firm*—Oblon, Spivak, McClelland, Maier & Neustadt, P.C.

(57) ABSTRACT

A baking unit of the present invention comprises: a hot plate on which the substrate is placed; a casing; a gas supply tubes; a baffle ring which surrounds the wafer and is provided with a plurality of gas blowing apertures; and a rotation motor. An inert gas is supplied to the wafer from the plurality of blowing apertures which is moved by rotation or turn round of the baffle by using the rotation motor.

7 Claims, 9 Drawing Sheets

HEAT TREATMENT APPARATUS AND METHOD

BACKGROUND OF THE INVENTION

1. Field of the Invention

The present invention relates to an apparatus and method for coating a film such as an interlayer dielectric film on a substrate such as a semiconductor wafer.

2. Description of the Related Art

In the manufacturing process of a semiconductor device, a dielectric film such as an interlayer dielectric film is spin-coated on a semiconductor wafer by, for example, the sol-gel method, the silk method, the speed film method or the Fox method, and is applied a chemical treatment, or a heat treatment so as to form a desired film. For example, in the silk method, speed film method and Fox method, a spin-coat solution is coated on a cooled semiconductor wafer, then heated and cooled. Further, in a low oxygen concentration atmosphere the wafer is heated and then cooled so as to cure the coated film.

If the oxygen concentration is raised during heating the wafer in the curing process, a dielectric constant of the interlayer dielectric film becomes high. Therefore, a prescribed amount of an inert gas such as a nitrogen gas is introduced during heating in the curing process the wafer placed in a chamber. Concretely, a plurality of gas nozzles are employed around a circumference of the wafer placed on a hot plate in the chamber in order to introduce the inert gas and the gas inside the chamber is exhausted from an exhaust port over the center of the hot plate.

However, the inert gas flows in different manners depending upon the location of the wafer which is near to or distant from the nozzles which are disposed at fixed positions. Therefore, The temperature on the wafer is made uneven and the oxygen concentration around the wafer is made uneven, thereby reducing uniformities of film characters such as a dielectric constant, hardness and peel strength.

BRIEF SUMMARY OF THE INVENTION

An object of the present invention is to provide a heat treatment apparatus and method which are capable of heating uniformly over the entire surface of a substrate such as a semiconductor wafer, by supplying uniformly the substrate with a prescribed gas.

The heat treatment apparatus of the present invention comprises: a hot plate on which the substrate is placed; a chamber for containing the hot plate; a gas supply mechanism for supplying the chamber with a prescribed gas; a baffle member which surrounds the substrate in the chamber and is provided with a plurality of gas blowing apertures for supplying the prescribed gas from the gas supply mechanism; and a rotation mechanism for rotating or turning round the baffle member.

Further, the heat treatment apparatus of the present invention may comprises: a hot plate on which said substrate is placed; a chamber for containing the hot plate; a gas supply mechanism with a plurality of gas exits for supplying the chamber with a prescribed gas; and a rotation mechanism for rotating or turning round the gas exits.

Further, the heat treatment apparatus of the present invention may comprises: a hot plate on which the substrate is placed; a chamber for containing the hot plate; a gas supply mechanism for supplying the chamber with a prescribed gas; and a gas diffusion mechanism for diffusing the prescribed gas from the gas supply mechanism which includes: a baffle member which surrounds the substrate in the chamber and is provided with a plurality of gas blowing apertures for supplying the prescribed gas from the gas supply mechanism; a plurality of fins which is provided at the baffle member and rotates by a pressure of the prescribed gas from the gas supply mechanism; and a baffle member support means for holding the baffle member.

Further, the heat treatment method of the present invention comprises the steps of: a first step for placing the substrate on a hot plate; a second step for arranging a baffle member thereby surrounding the hot plate; and a third step for supplying the substrate with an inert gas from a plurality of gas blowing apertures provided at the baffle member which is rotated or turned round thereby moving said plurality of gas blowing apertures.

Further, the heat treatment method of the present invention may comprises the steps of: a first step for placing the substrate on a hot plate: a second step for containing the hot plate in a chamber: a third step for heating the substrate, by supplying the substrate with a prescribed inert gas from a plurality of moving gas exits which are rotated or turned round around the substrate, and at the same time by exhausting the chamber.

Further, the heat treatment method of the present invention may comprises the steps of: a first step for placing the substrate on a hot plate; a second step for containing in a chamber the hot plate and a baffle member which surrounds the substrate; a third step for heating the substrate, by supplying the substrate with a prescribed inert gas from a plurality of moving gas blowing apertures which are rotated or turned round around the substrate by using a pressure of the prescribed inert gas to fins provided at the baffle member, and at the same time by exhausting the chamber.

According to the present invention, an inert gas during the heat treatment is applied uniformly all over the surface of the substrate, by using moving gas blowing apertures or moving gas exits, thereby accomplishing a uniform heat treatment of the substrate, obtaining uniform and high quality films on the substrates, reducing inferior and defective products and improving a product yield.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detail description of the preferred embodiments given below, serve to explain the principles of the invention.

FIG. 4A is a cross sectional view of the baking unit (DLB) during aging a wafer, while

DETAILED DESCRIPTION OF THE INVENTION

The spin on dielectric (SOD) system is used for coating an interlayer dielectric film. First, the SOD system including a plurality of baking unit (DLB) and cure unit (DLC) is explained.

Figure 1:
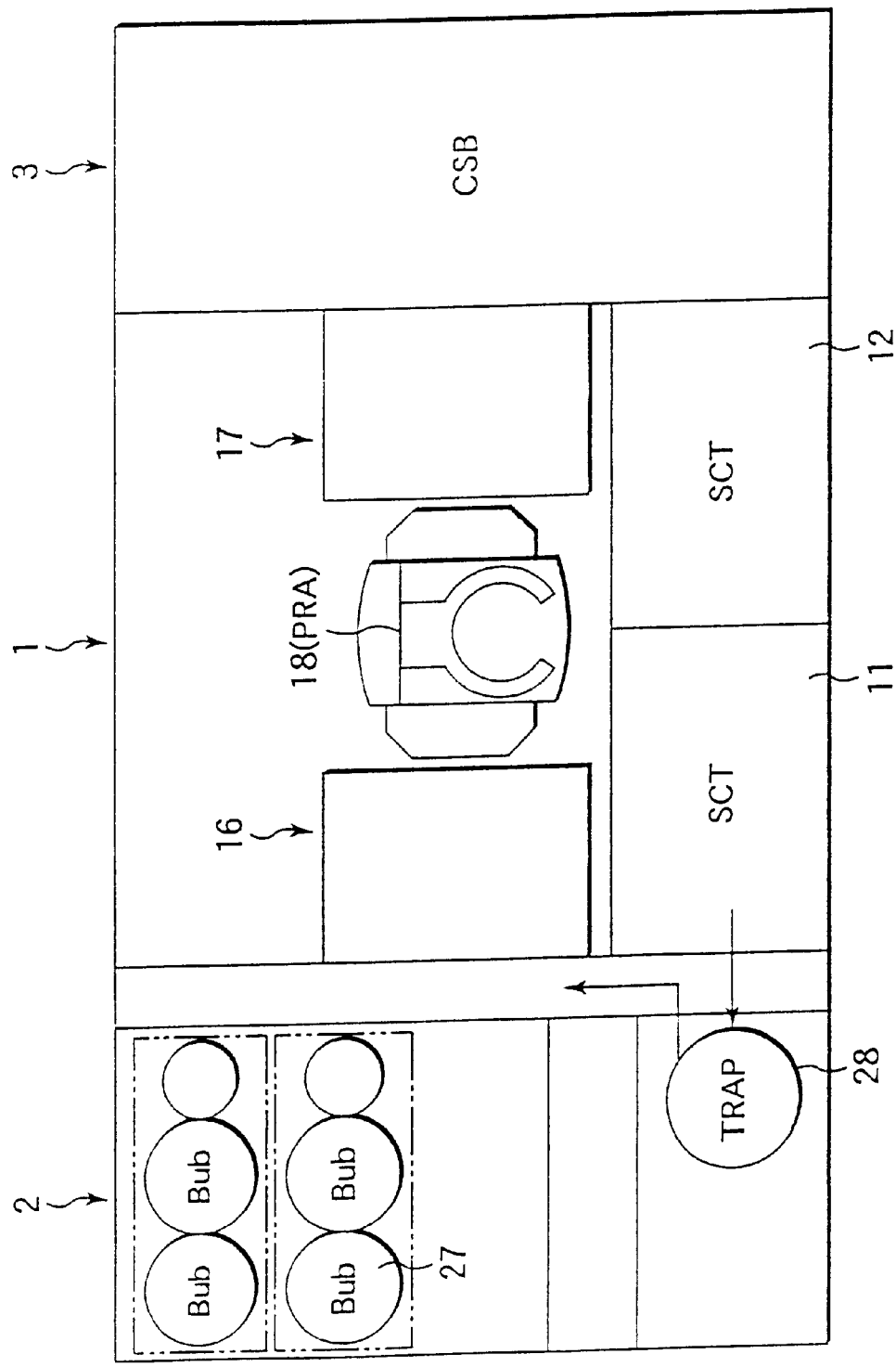
FIG. 1 is a top view of the spin on dielectric (SOD) system including a baking unit (DLB) and a cure unit (DLC).

As shown in FIG. 1, the SOD system comprises a process section 1, a side cabinet 2, and a carrier station (CSB) 3. Coating process units (SCT) 11, 12 are arranged in an upper portion on the front side of the process section 1. Bubblers (Bub) 27 for supplying a chemical liquid and a trap (TRAP) 28 for cleaning the exhaust gas are arranged in the rear top side of the side cabinet 2. Process unit groups 16, 17 are arranged in the central portion of the process section 1, and a wafer transfer mechanism (PRA) 18 for transferring a semiconductor wafer W is vertically movable between these process unit groups 16 and 17.

Figure 2:
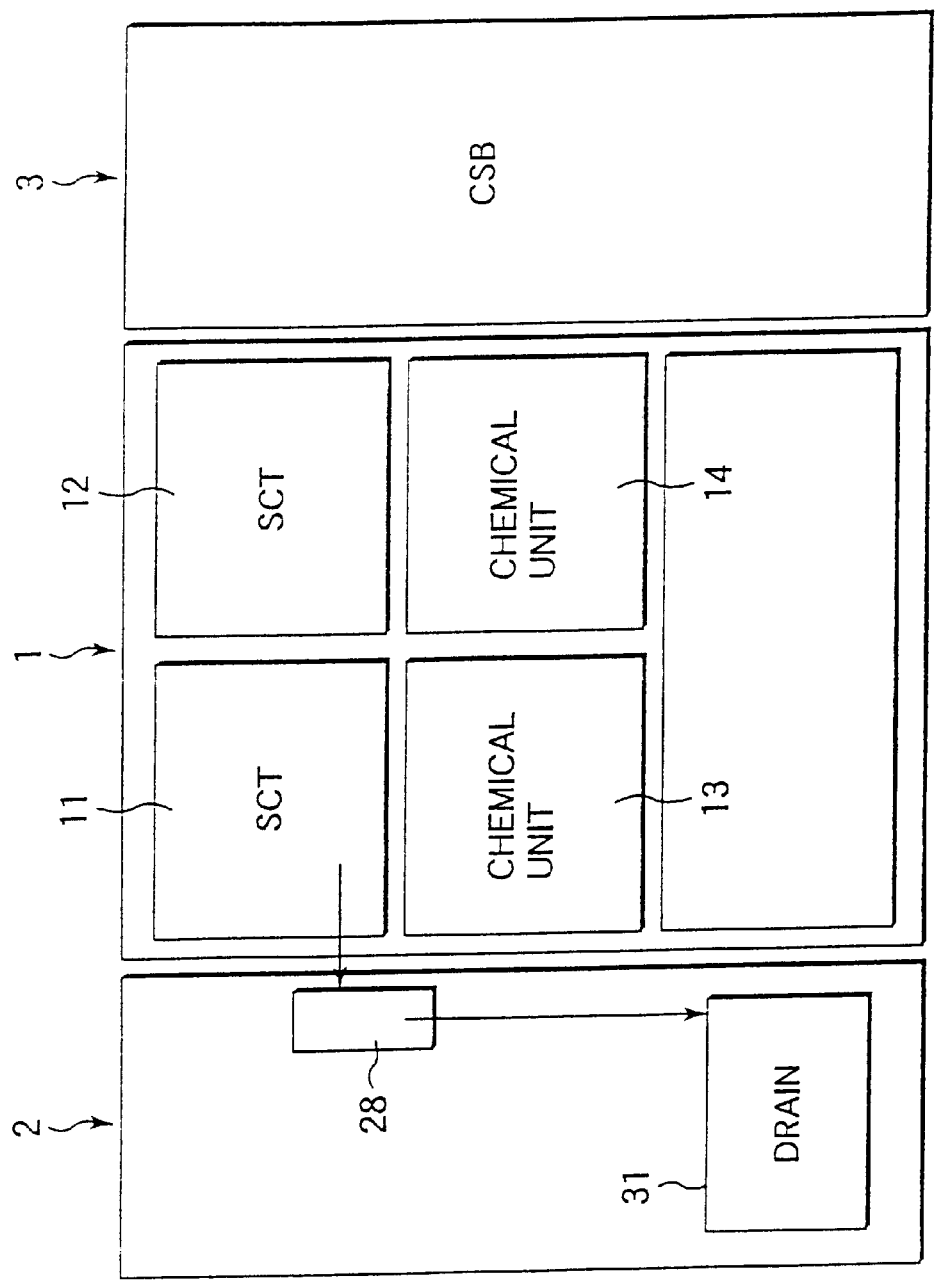
FIG. 2 is a front view of the SOD system as shown in FIG. 1.

As shown in FIG. 2, at the lower stair of the side cabinet 2, a power supply source (not shown in FIG. 2), a chemical liquid chamber (not shown in FIG. 2) for storing a chemical liquid such as hexamethyl disilane (HMDS) and a gas such as an ammonia gas $NH_3$, and a drain 31 for discharging waste liquids used in the SOD system are arranged below the bubblers (Bub) 27. Chemical units 13, 14 are arranged below the coating process units (SCT) 11, 12, respectively.

Figure 3:
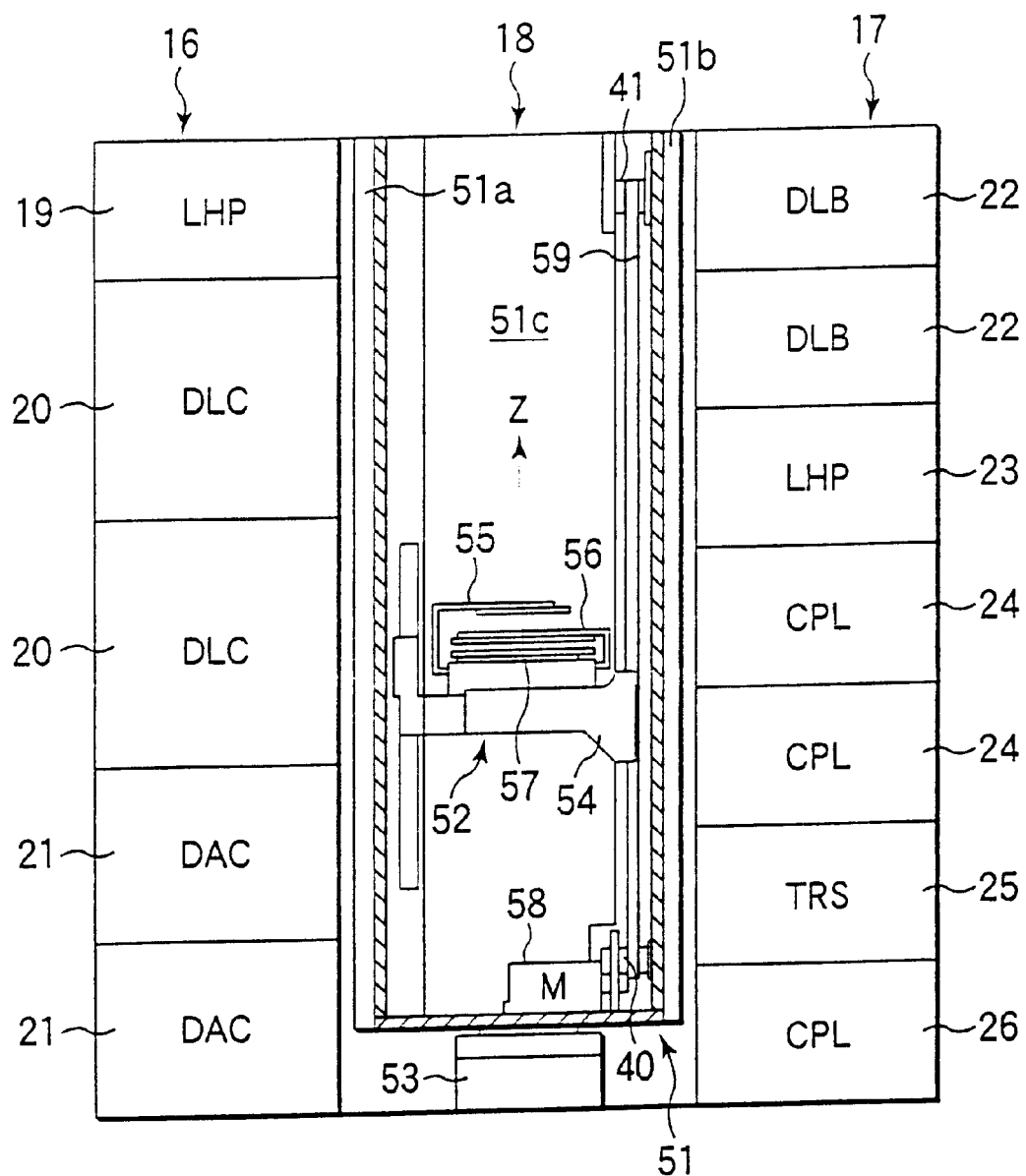
FIG. 3 is a front view of treatment unit groups in the SOD system as shown in FIG. 1.

As shown in FIG. 3, the wafer transfer mechanism (PRA) 18 includes a cylindrical support body 51 extending in a Z-direction and having vertical walls 51a, 51b and a side surface open portion 51c positioned between these vertical walls 51a and 51b, and a wafer transfer body 52 arranged inside the cylindrical support body 51 and vertically movable in the Z direction along the cylindrical support body 51. The cylindrical support body 51 can be rotated by the rotary driving force of a motor 53. In accordance with rotation of the cylindrical support body 51, the wafer transfer body 52 is also rotated.

The wafer transfer body 52 includes a transfer base 54, and three wafer transfer arms 55, 56, 57 movable back and forth along the transfer base 54. The wafer transfer arms 55, 56, 57 are of sizes capable of passing through the side surface open portion 51c of the cylindrical support body 51. These wafer transfer arms 55, 56, 57 can be independently moved back and forth by a motor and a belt mechanism arranged within the transfer base 54. The wafer transfer body 52 can be moved in the vertical direction by driving a belt 59 by a motor 58. Further, a reference numeral 40 shown in FIG. 3 denotes a driving pulley, and a reference numeral 41 denotes a driven pulley.

The process unit group 16 on the left hand side comprises a low temperature hot plat unit (LHP) 19, two cure units (DLC) 20, and two aging units (DAC) 21, which are stacked one upon the other as viewed from the upper side. On the other hand, the process unit group 17 on the right hand side includes two baking units (DLB) 22, a low temperature hot plate unit (LHP) 23, two cooling plate units (CPL) 24, a transport unit (TRS) 25, and a cooling plate unit (CPL) 26, which are stacked one upon the other as viewed from the upper side. Here, the transport unit (TRS) 25 also can functions as the cooling plate unit.

When an interlayer dielectric film or the like is formed on a wafer W by means of, for example, the sol-gel method by using the SOD system described above, the wafer W is transferred through the cooling plate unit (CPL) 24 or 26, the coating process unit (SCT) 11 or 12, the aging unit (DAC) 21, the hot plate unit (LHP) 19 or 23, and the baking unit (DLB) 22, in that order for applying predetermined treatments to the wafer W.

When an interlayer dielectric film or the like is formed on the wafer W by means of the silk method or the speed film method, the wafer W is transferred through the cooling plate unit (CPL) 24 or 26, the coating process unit (SCT) 11 or 12 (for coating the adhesion promoter), the hot plate unit (LHP) 19 or 23, the coating process unit (SCT) 11 or 12 (for coating the chemical liquid for forming the film), the low temperature hot plate unit (LHP) 19 or 23, the baking unit (DLB) 22, and the cure unit (DLC) 20, in that order.

Further, when an interlayer dielectric film or the like is formed on the wafer W by the Fox method, the wafer W is transferred through the cooling plate unit (CPL) 24 or 26, the coating process unit (SCT) 11 or 12, the low temperature hot plate unit (LHP) 19 or 23, the baking unit (DLB) 22 and the cure unit (DLC) 20, in that order.

Here, film materials are not limited to the above examples. Various organic, inorganic or hybrid materials are used.

Next, the cure unit (DLC) 20 and baking unit (DLB) 22 of the present invention are explained.

Figure 4A:
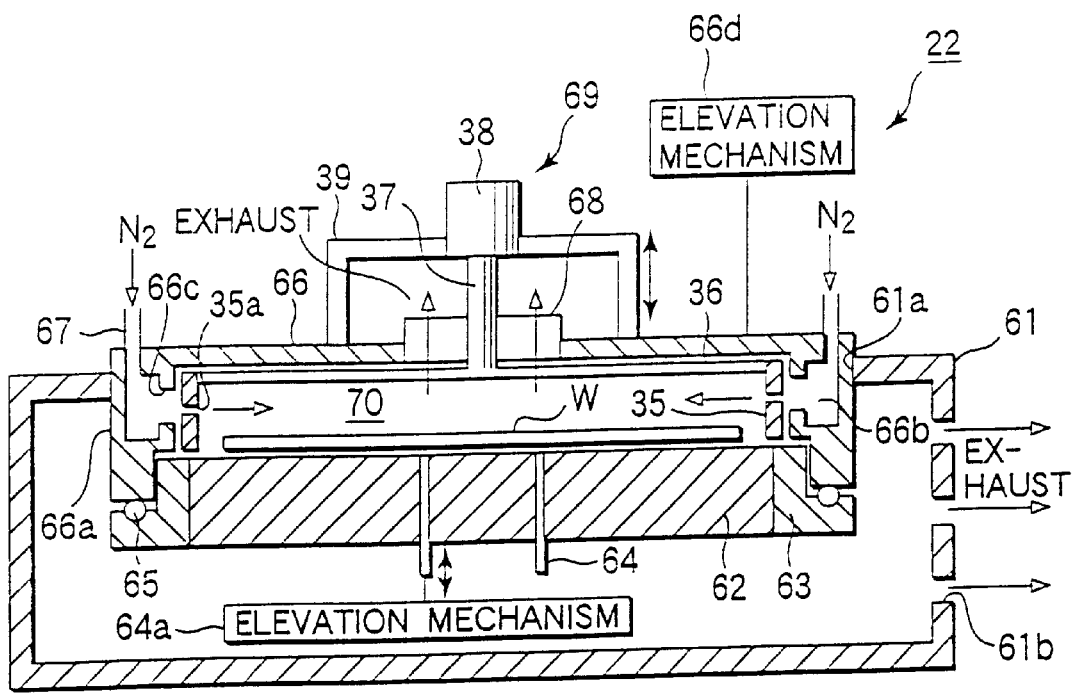
Figure 4B:
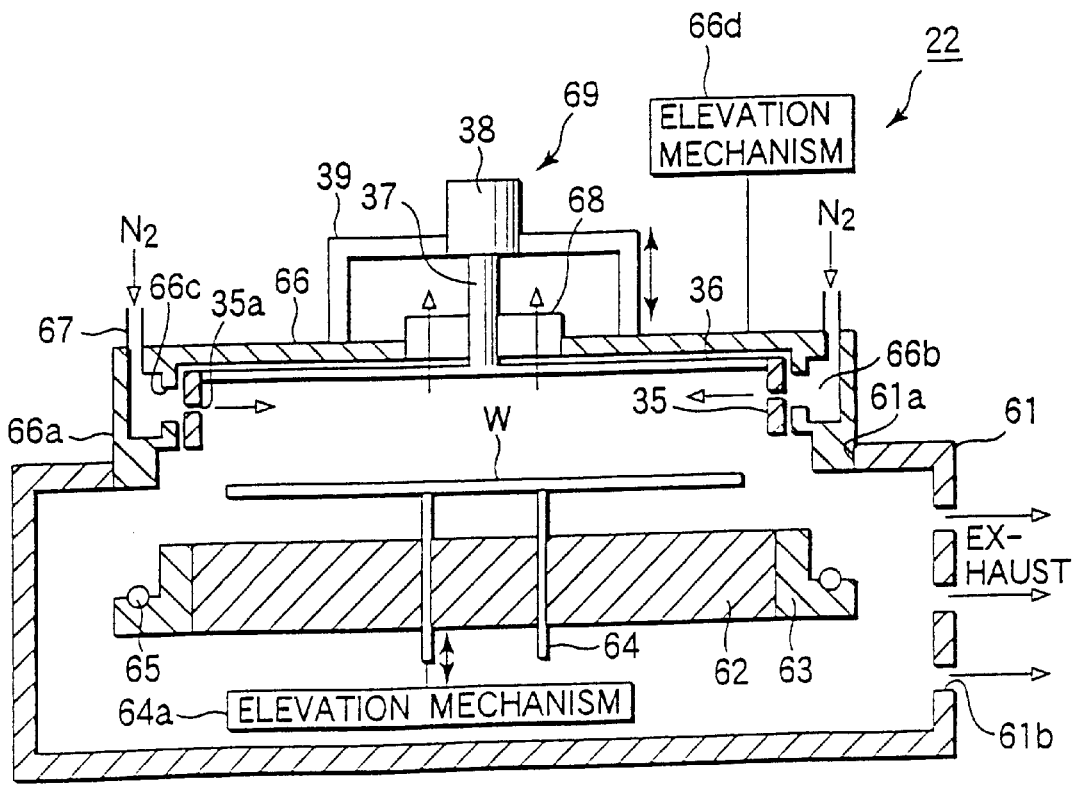
FIG. 4B is a cross sectional view of the baking unit (DLB) before and after aging the wafer.

FIG. 4A is a cross sectional view of a baking unit (DLB) 22 during baking a wafer W, while FIG. 4B is a cross sectional view of a baking unit (DLB) 22 during delivering the wafer.

The baking unit (DLB) 22 comprises: a casing 61; a hot plate 62 for heating the wafer W; a support ring 63 for surrounding the hot plate 62; a plurality of elevation pins 64 which pass through the hot plate 62; an elevation mechanism 64a for ascending and descending the elevation pins 64; a cover 66; an elevation mechanism 66d for ascending and descending the cover 66; a gas supply tube 67; a gas supply route 66b provided on a wall 66a of the cover 66; an exhaust mechanism 68 provided at the center of the cover 66; and a gas diffusion mechanism 69 provided on the cover 66.

An aperture 61a is provided on the top surface of the casing 61. An exhaust port 61b is provided on the wall of the casing 61. Further, a not-shown shutter for delivering the wafer W between the wafer transfer mechanism (PRA) 18 is provided on other wall of the casing 61.

Further, a plurality of not-shown support pins are provided on the surface of the hot plate 62, thereby placing the wafer W at a prescribed distance from the surface of the hot plate 62 of which heater raises the temperature from 50° C. to 350° C. At least three elevation pins 64 are provided, although only two of them are shown in FIG. 4A. The elevation pins hold the wafer W at a prescribed height during delivering the wafer w, while they are retracted at, for example, the surface of the hot plate 62 during heating the wafer W.

As shown in FIG. 4A, a step for a seal ring 65 is provided with the support ring 63, thereby forming a closed space 70, when the lower surface of the wall 66a of the cover 66 touches the seal ring. Two gas supply tubes 67 are provided at two points which are point-symmetrical concerning the center of the cover 66, and four gas exits 66c are provided at a surface of an inner wall, thereby introducing an inert gas such as a nitrogen gas from the gas supply route 66b into the closed space 70.

The gas diffusion mechanism 69 comprises: a rotation motor 38; a fixing jig 39 for fixing the rotation motor 38 to the cover 66; a rotation axis 37 fixed to the rotation motor 38; a baffle ring 35 surrounding the wafer W; and a connecting member 36 for connecting the rotation axis 37 with the baffle ring 35 which is provided with eight gas blowing apertures 35a. Further, a not-shown exhaust duct is provided in such a manner that the rotation motor 38 is not exposed to the gas exhausted from the exhaust mechanism 68.

The rotation motor 38 rotate the baffle ring 35, or turn round the baffle ring 35 clockwise and counterclockwise within a prescribed angle, thereby rotating or turn round the gas blowing apertures 35a through which the nitrogen gas introduced through the gas exit 66c is introduced into the closed space 70.

Next, another embodiment of the baking unit (DLB) 22 is explained.

Figure 5:
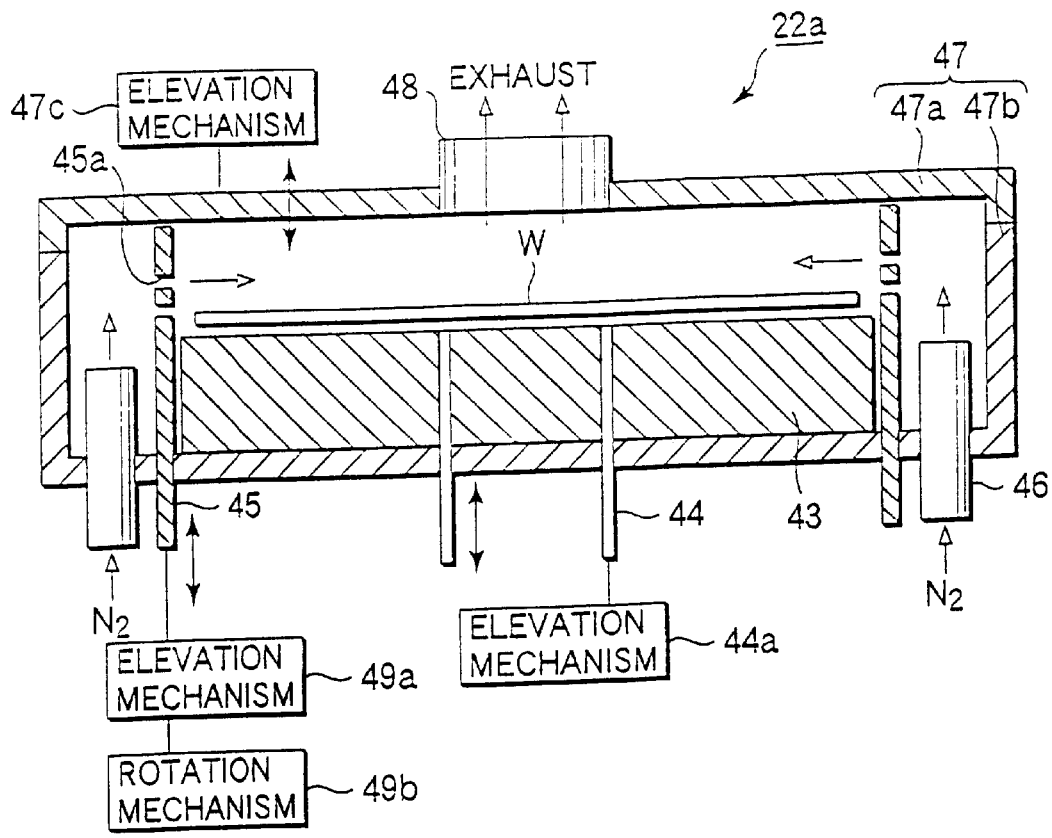
FIG. 5 is a cross sectional view of another baking unit (DLB).

FIG. 5 is a cross sectional view of another baking unit (DLB) 22a which comprises: a chamber 47 comprising a cover 47a and lower container 47b; an exhaust mechanism 48 provided on the cover 47a; a hot plate 43 in the chamber 47; a plurality of elevation pins 44 which pass through the hot plate 43; an elevation mechanism 44a for ascending and descending the elevation pins 44; a baffle ring 45 surrounding the hot plate 43; and gas nozzles 46 provided on a circumference of a floor of the circumference of the baffle ring 45.

An elevation mechanism 47c ascends and descends the cover 47a. Eight gas blowing apertures 45a are provides at prescribed positions of the baffle ring 45 similar to those positions of the baffle ring 45. Further, the baffle ring 45 is ascended and descended by an elevation mechanism 49a and is rotated or turned round by a rotation mechanism 49b.

For example, four gas nozzles 46 provided every 90° at the floor of the container 47b supply the nitrogen gas through the gas blowing apertures 45a to the hot plate 43. By rotating, or turning round the baffle ring 45, the nitrogen gas is supplied over the hot plate 43 from moving gas blowing apertures 45a.

Figure 6:
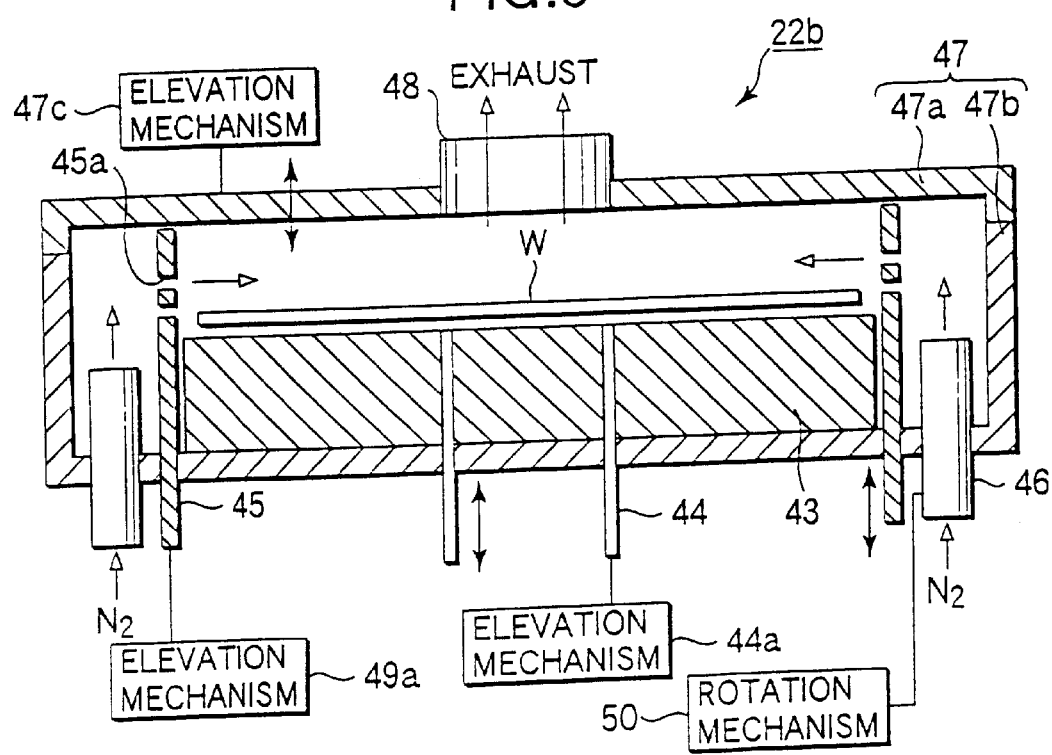
FIG. 6 is a cross sectional view of still another baking unit (DLB).

A baking unit (DLB) 22b as shown in FIG. 6 is a variation of the baking unit (DLB) 22a. In the baking unit (DLB) 22b, the gas nozzles 46 is rotated, or turned round by a rotation mechanism 50. In this case, the baffle ring 45 is not necessarily provided, and the baffle ring 45 is not necessarily rotated.

Next9, still another embodiment of the baking unit (DLB) 22 is explained.

Figure 7:
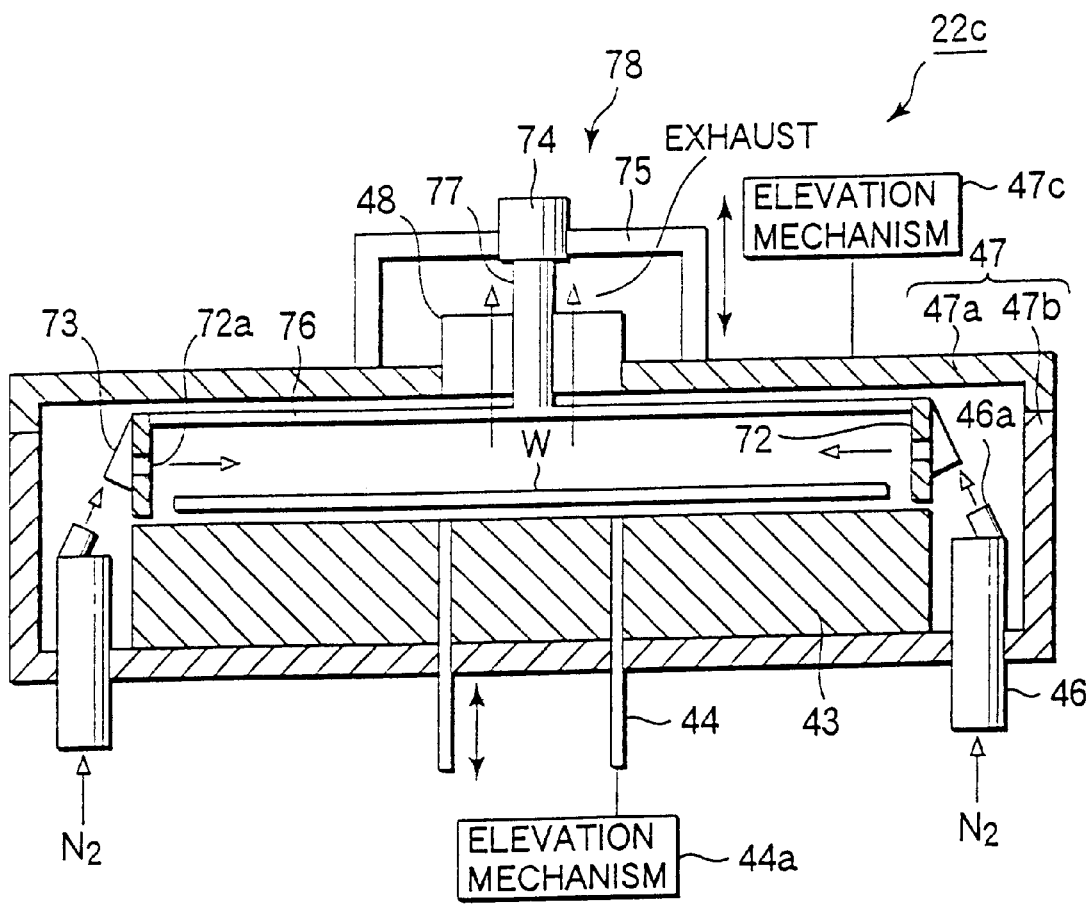
FIG. 7 is an illustration of a still further another baking unit (DLB).

FIG. 7 is a cross sectional view of another baking unit (DLB) 22c which includes the same components as those of the baking unit (DLB) 22a such as the cover 47a, the lower container 47b, the exhaust mechanism 48, the hot plate 43, the elevation pins 44 and gas nozzles 46.

The baking unit (DLB) 22c further includes a gas diffusion mechanism 78 which comprises: a baffle ring 72 surrounding the wafer W; a rotation axis 77; a rotation support member 74 for supporting the rotation axis 77; a fixing member 75 for fixing the rotation support member 74 to the cover 47a; and a connecting member 76 for connecting the rotation axis 77 to the baffle ring 72 which is provided with, for example, twelve gas blowing apertures 72a at stated intervals along the circumference of a circle and is also provided with fins 73 at its outer circumference.

The gas exits 46a of the gas nozzles 46 blast the nitrogen gas at a prescribed pressure obliquely upward toward the fins 73, thereby rotating baffle ring 72. Thus, the nitrogen gas is supplied to the wafer W from moving gas blowing apertures 72a.

Figure 8:
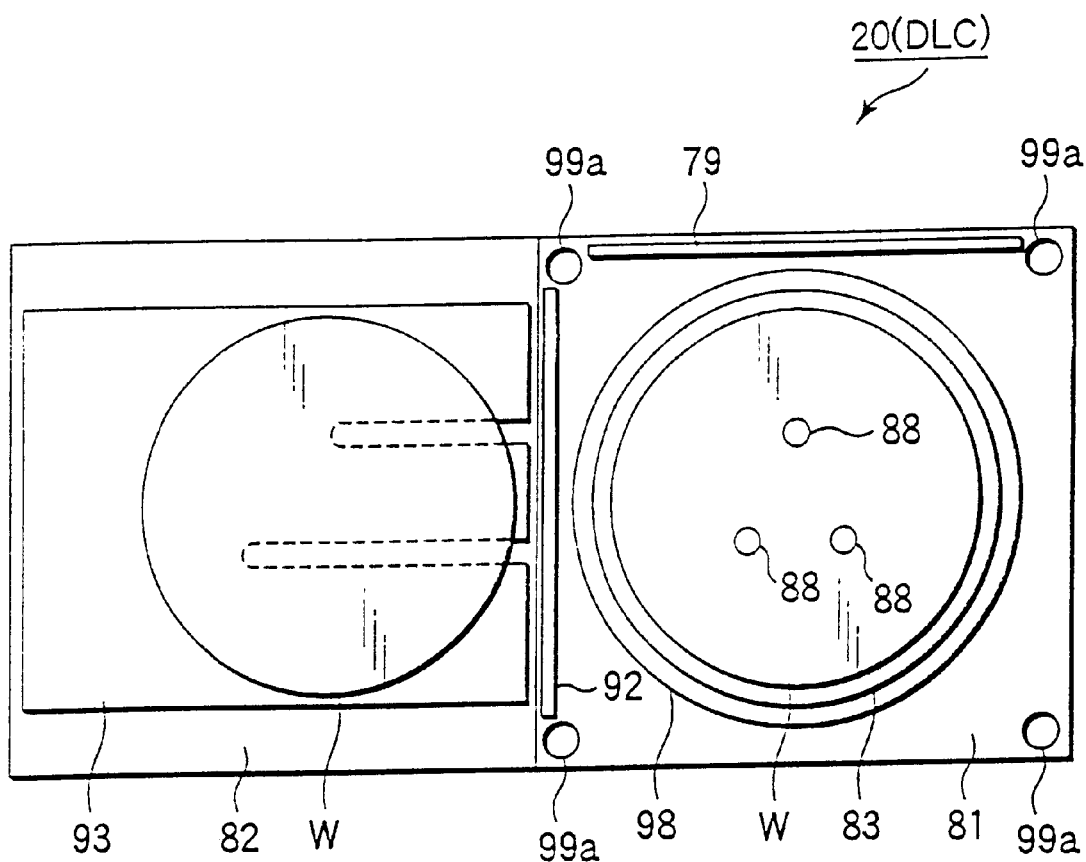
FIG. 8 is a plan view of the cure unit (DLC).
Figure 9:
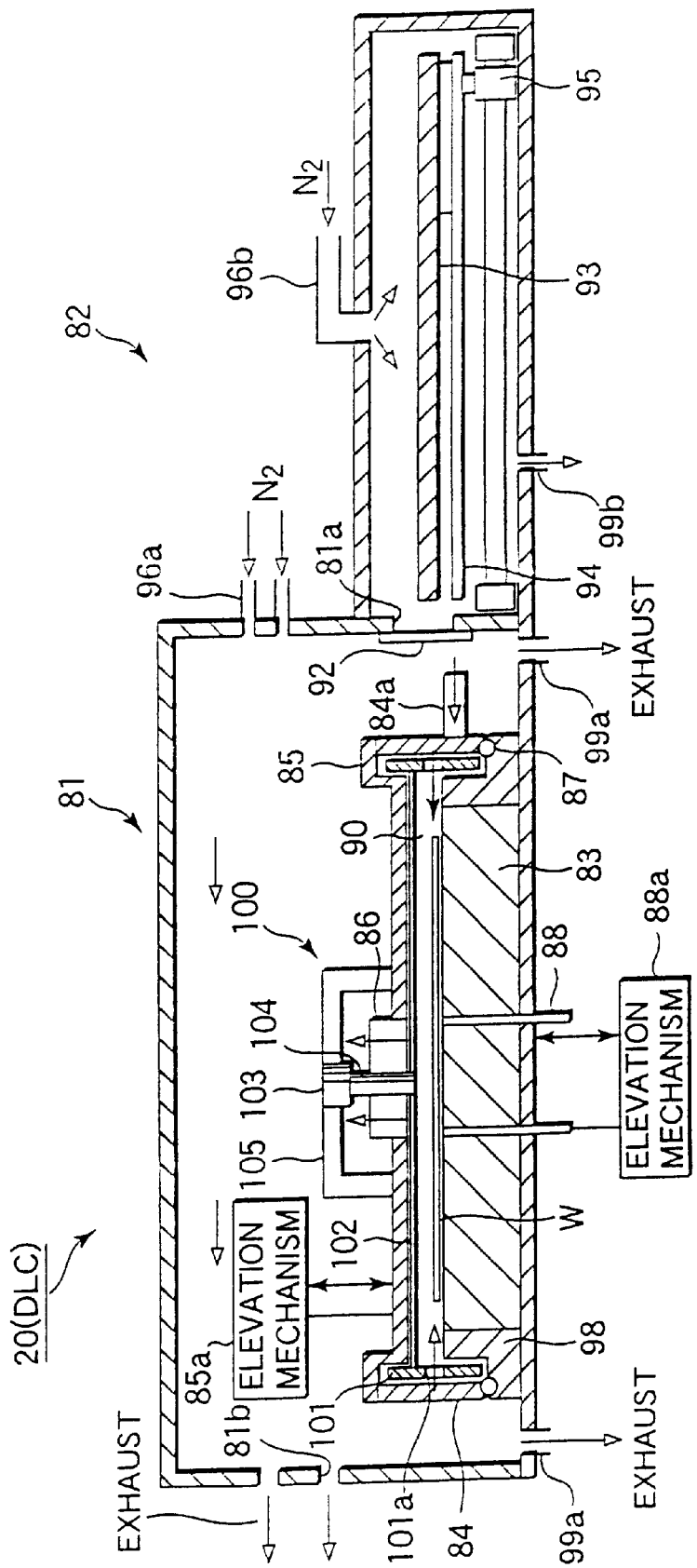
FIG. 9 is a cross sectional view of the cure unit (DLC) as shown in FIG. 8.

FIG. 8 is a plan view of a cure unit (DLC) 20 of the present invention, while FIG. 9 is a cross sectional view thereof during heating the wafer W. The cure unit (DLC) 20 includes a heating chamber 81, a cooling chamber 82 adjacent to the heating chamber 81 and a shutter 92 between them for delivering the wafer W. Further, the heating chamber 81 is provided with a shutter 79 for delivering the wafer W to and from the wafer transfer mechanism (PRA) 18.

As shown in FIG. 9, the nitrogen gas is supplied in the heating chamber 81 through the gas supply tube 96a and is exhausted from exhaust ports 81b at the wall and four exhaust ports 99a at the floor corners, thereby maintaining a low oxygen concentration atmosphere in the heating chamber 81. When the shutter 79 is opened, the air flows in and rests at the corner of the heating chamber 81. However, the heating chamber 81 is kept in a uniform nitrogen atmosphere by exhausting that air from the exhaust port 99a.

The heating chamber 81 comprises: a hot plate 83 for heating the wafer W from 200° C. to 470° C.; a support ring 98 surrounding the hot plate 83; three elevation pins 88 ascended and descended by an elevation mechanism 88a; a cover 85 ascended and descended by an elevation mechanism 85a; a gas purge ring 84 which is connected with the cover 85 and surrounds the circumference of the cover 85; a gas supply tube 84a for supplying the gas purge ring 84 with the nitrogen gas; an exhaust mechanism 86 provided at the center of the cover 85; and a gas diffusion mechanism 100 for diffusing the nitrogen gas from the gas purge ring 84.

Further, a plurality of not-shown support pins are provided on the surface of the hot plate 83, thereby placing the wafer W during heating at a prescribed distance from the surface of the hot plate. The elevation pins 88 hold the wafer W at a prescribed height during delivering the wafer w, while they are retracted at, for example, the surface of the hot plate 83 during heating the wafer W. A step for a seal ring 87 is provided with the support ring 98, thereby forming a closed space 90, when the lower surface of the gas purge ring 84 touches the seal ring 87.

The gas diffusion mechanism 100 is similar to the gas diffusion mechanism 69. Concretely, the gas diffusion mechanism 100 comprises: a rotation motor 103; a fixing jig 105 for fixing the rotation motor 103 to the cover 85; a rotation axis 104 fixed to the rotation motor 103; a baffle ring 101 surrounding the wafer W; and a connecting member 102 for connecting the rotation axis 104 with the baffle ring 101 which is provided with, for example, eight gas blowing apertures 101a which is moved by the rotation or turning round of the rotation motor 103.

For example, four gas exits are provided every 90° at the gas purge ring 84 so as to supply the nitrogen gas through the gas blowing apertures 110a to the wafer W.

Further, a not-shown exhaust duct is provided in such a manner that the rotation motor 103 is not exposed to the gas exhausted from the exhaust mechanism 86, in order to prevent the heating chamber 81 from being contaminated by the materials vaporized or sublimated from the coated film on the wafer W.

The heating chamber 81 is connected with the cooling chamber 82 by a connection port 81a which is opened or closed by the shutter 92. A cooling plate 93 for cooling the wafer W is moved horizontally into the heating chamber 81 along a guide plate 94 by a movement mechanism 95. Therefore, the wafer W after completing the heat treatment in the heating chamber 81 is transferred to the cooling plate 93, transported to the cooling chamber 82 where the wafer W is cooled at, for example, 15° C. to 25° C.

A low oxygen concentration atmosphere is maintained in the cooling chamber 82 by introducing the nitrogen gas from the gas supply tube 96b which is also exhausted from exhaust port 99b at the floor of the cooling chamber 82.

Next, an exemplary process is explained concerning a formation of an interlayer dielectric film by the silk method or the speed film method by using the cure unit (DLC) 20 and the baking unit (DLB) 22 as shown in FIGS. 4A and 4B.

First, The wafer W is transported from the carrier station (CSB) 3 to the transport unit (TRS) 25, and is further transported by the wafer transfer mechanism (PRA) 18 to the cooling plate (CPL) 24 or 26 for cooling the wafer W in order to keep the temperature of the wafer W constant before the spin coating and to obtain uniform quality of the film. Then, the wafer W is transported to the coating process unit (SCT) 11 or 12 in order to spin-coat an adhesion promoter as a first coating liquid on the wafer W, thereby promoting an adhesion of a film to the wafer W. Then, the wafer W is transported to the cooling plate (CPL) 24 or 26 to control its temperature.

The wafer W after the temperature control in the cooling plate (CPL) 24 or 26 is then transported to the coating process unit (SCT) 11 or 12 in order to spin-coat a main coating liquid for the interlayer dielectric film as a second coating liquid. Then, the wafer W is heated suitably in the low temperature hot plate (LHP) 19 or 23 in order to remove components such as water which evaporate at relatively low temperatures.

Then, the wafer W is transported to the baking unit (DLB) 22 and then to the cure unit (DLC) 20, although the wafer W is transported directly to the cure unit (DLC) 20, depending upon the solvents in the main coating liquid or the second coating liquid. Hereinafter, the heat treatment in the baking unit (DLB) 22 and the following heat treatment in the cure unit (DLC) 20 are explained.

The heat treatment temperature in the baking unit (DLB) 22 is higher than that in the low temperature hot plate (LHP) 19 or 23 and lower than that in the cure unit (DLC) 20. Therefore, the solvents and other components in the main coating liquid which can not be evaporated or sublimated in the low temperature hot plate (LHP) 19 or 23 are removed in the baking unit (DLB) 22. If the low temperature heat treatment is executed in the same heat treatment unit as that wherein the high temperature heat treatment is executed, the wafer may possibly be contaminated by the components evaporated at the high temperature left in the heat treatment unit. In other words, it becomes possible to avoid the wafer contamination by the proper use of the heat treatment units, in accordance with the evaporation and sublimation components.

As shown in FIG. 4B, the wafer W is carried from the low temperature hot plate (LHP) 19 or 23 into the baking unit (DLB) 22 by using the wafer transfer mechanism (PRA) 18 and is received by received on the elevation pins 64, under the conditions that the cover 66 is ascended; the nitrogen gas is supplied from the gas supply tube 67 to the gas supply route 66b; and the rotation motor 38 is rotated or turned round. Then, the elevation pins 64 and the cover 66 are descended so as to forming the closed space 70. The wafer is heated on the hot plate 62 for a prescribed time period in the closed space 70.

Figure 10A:
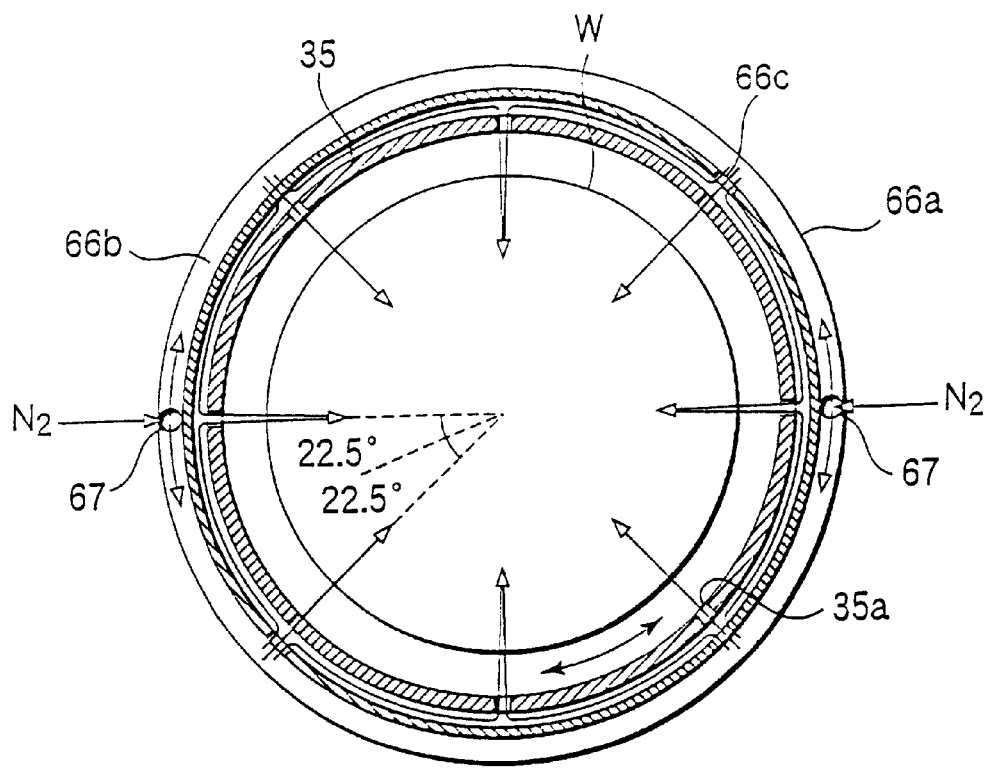
FIGS. 10A and 10B are plan views of the baking unit (DLB) for explaining a nitrogen gas supply during heating a wafer.
Figure 10B:
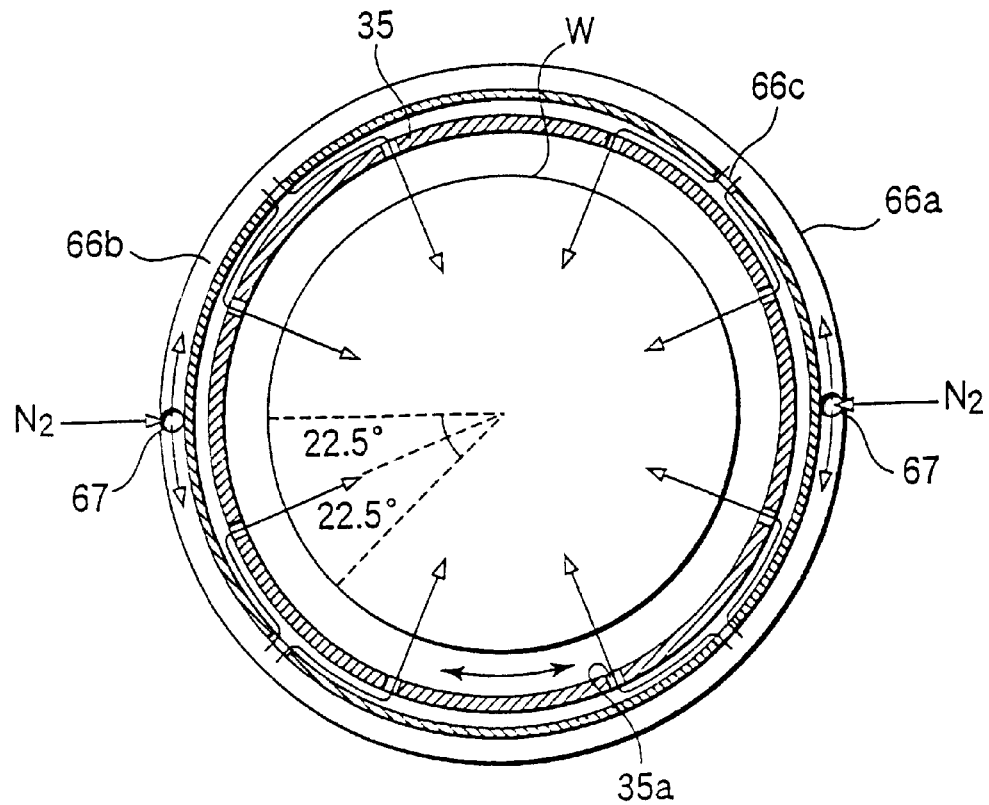

FIGS. 10A and 10B are plan views of the closed space 70 for explaining the gas flow around the wafer on the hot plate 62. FIG. 10A shows a state just prior to the reverse from the counterclockwise turn to the clockwise turnoff the baffle ring 35, while FIG. 10B shows a 22.5 clockwise rotated state after the reverse.

The nitrogen gas supplied from two gas supply tubes 67 to the gas supply route 66b is blasted from four gas exits 66c toward the baffle ring 35. The gas exits 66c are not moved, because the cover 66 is not rotated.

However, the eight gas blowing apertures 35a are moved from the state as shown in FIG. 10A to the state as shown in FIG. 10B, by the 22.5 clockwise rotation. They are moved again to the state as shown in FIG. 10A by the further 22.5 clockwise rotation.

Further, they are moved to the state as shown in FIG. 10B by the 22.5 counterclockwise rotation. Then, they are moved again to the state as shown in FIG. 10A by the further 22.5 counterclockwise rotation. The gas blowing apertures 35a is always moved by these turning round motions. Therefore, the nitrogen gas is supplied uniformly from all directions from the circumference of the wafer W.

Thus, it becomes possible to obtain wafers W with uniform and high quality interlayer dielectric films, because avoided is the conventional disadvantage that the nitrogen gas is supplied only from a specific direction, thereby causing a temperature distribution and an oxygen concentration distribution on the wafer W, resulting in reduction in uniformities of dielectric constant, hardness and peel strength.

Then, the wafer W is carried out from the baking unit (DLB) 22 by using the wafer transfer mechanism (PRA) 18 in a reverse order of procedures for carrying the wafer W into the baking unit (DLB) 22. Then, the wafer W is transported into the cure unit (DLC) 20 by opening the no-shown shutter 79, delivering the wafer W from the wafer transfer mechanism (PRA) 18 to the elevation pins 88 and finally closing the shutter 79.

At this time, the cover 85 and the gas diffusion mechanism 100 are elevated near the ceiling of the heating chamber 81 under the conditions that: the nitrogen gas is supplied from the gas supply tube 84a to the gas purge ring 84; and the rotation motor 103 is rotated or turned round. Further, at this time, the heating chamber 81 may be exhausted from the exhaust ports 99a, by closing the shutter 79 in order to reduce the oxygen concentration in the heating chamber 81.

Then, the elevation pins 88, the cover 85 and the gas diffusion mechanism 100 are descended so as to forming the closed space 90. The wafer is heated on the hot plate 83 for the curing for a prescribed time period in the closed space 90. The nitrogen supply here is the same as that in the baking unit (DLB) 22 and it becomes possible, by using this nitrogen supply from the moving gas blowing apertures 101a, to obtain the interlayer dielectric films with uniform qualities.

During the prescribed curing treatment in the heating chamber 81, the cooling chamber 82 is kept stable at a prescribed low oxygen concentration atmosphere, by introducing an inert gas from the gas supply tube 96b into the cooling chamber 82. After completing the prescribed curing treatment in the heating chamber 81, the cover 85, the gas diffusion mechanism 100 and the elevation pins 88 are elevated and the wafer W is held at a prescribed height. Then, the connecting port 81a is opened by opening the shutter 92, the cooling plate 93 is introduced into the heating chamber 81, the wafer W is delivered from the elevation pins 88 to the cooling plate 93, and finally the elevation pins 88 is retracted.

Then, the cooling plate 93 is brought back to the cooling chamber 82 and the wafer W is cooled for a prescribed time period. Then, after completing the cooling treatment, the inert gas supply from the gas supply tubes 96b is stopped temporarily, the wafer W is delivered to the elevation pins 88 in the heating chamber 81 and the wafer W is carried out from the heating chamber 81 by using the wafer transfer mechanism (PRA) 18. The wafer W on the wafer transfer mechanism (PRA) 18 is brought back to the carrier station (CSB) 3 through the transport unit (TRS) 25.

Although the heat treatment apparatuses of the present invention is applied to the cure unit (DLC) 20 and the baking unit (DLB) 22 in the spin on dielectric (SOD) system, the present invention is not limited to the above-explained embodiments. For example, the baffle ring may be turned round along a circular guide by an air cylinder, in place of employing the rotation motor. Further, lower portion or the upper portion of the baffle ring may be driven by the rotation motor, or the air cylinder. Further, the gas blowing apertures of the baffle ring are not limited to those as shown in FIGS. 10A and 10B. For example, more number of gas blowing apertures may be provided, the diameter of the gas blowing apertures may be changed in accordance with its positions, and a plurality of sub-apertures may be provided at one gas blowing aperture. Further, the substrate is not limited to the semiconductor wafer, but other kinds of substrate such a substrate for liquid crystal display (LCD) apparatus.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A heat treatment apparatus for heating a substrate, which comprises:
    a hot plate on which said substrate is placed;
    a chamber for containing said hot plate;
    a gas supply mechanism for supplying said chamber with a prescribed gas;
    a baffle member which surrounds said substrate in said chamber and is provided with a plurality of gas blowing apertures for supplying said prescribed gas from said gas supply mechanism; and
    a rotation mechanism for rotating or turning round said baffle member.

2. A heat treatment apparatus for heating a substrate, which comprises:
    a hot plate on which said substrate is placed;
    a chamber for containing said hot plate;
    a gas supply mechanism with a plurality of gas exits for supplying said chamber with a prescribed gas; and
    a rotation mechanism for rotating or turning round said gas exits.

3. The heat treatment apparatus according to claim 2, wherein there is arranged between said hot plate and said gas exits in said chamber a baffle member which surrounds said hot plate and is provided with a plurality of gas blowing apertures for supplying said prescribed gas from said gas supply mechanism.

4. A heat treatment apparatus for heating a substrate, which comprises:
    a hot plate on which said substrate is placed;
    a chamber for containing said hot plate;
    a gas supply mechanism for supplying said chamber with a prescribed gas; and
    a gas diffusion mechanism for diffusing said prescribed gas from said gas supply mechanism which includes:
        a baffle member which surrounds said substrate in said chamber and is provided with a plurality of gas blowing apertures for supplying said prescribed gas from said gas supply mechanism;
        a plurality of fins which is provided at said baffle member and rotates by a pressure of said prescribed gas from said gas supply mechanism; and
        a baffle member support means for holding said baffle member.

5. A heat treatment method for heating a substrate, which comprises the steps of:
    a first step for placing said substrate on a hot plate;
    a second step for arranging a baffle member thereby surrounding said hot plate; and
    a third step for supplying said substrate with an inert gas from a plurality of gas blowing apertures provided at said baffle member which is rotated or turned round thereby moving said plurality of gas blowing apertures.

6. A heat treatment method for heating a substrate, which comprises the steps of:
    a first step for placing said substrate on a hot plate:
    a second step for containing said hot plate in a chamber:
    a third step for heating said substrate, by supplying said substrate with a prescribed inert gas from a plurality of moving gas exits which are rotated or turned round around said substrate, and at the same time by exhausting said chamber.

7. A heat treatment method for heating a substrate, which comprises the steps of:
    a first step for placing said substrate on a hot plate;
    a second step for containing in a chamber said hot plate and a baffle member which surrounds said substrate;
    a third step for heating said substrate, by supplying said substrate with a prescribed inert gas from a plurality of moving gas blowing apertures which are rotated or turned round around said substrate by using a pressure of said prescribed inert gas to fins provided at said baffle, and at the same time by exhausting said chamber.

* * * * *